United States Patent
Brennan et al.

(10) Patent No.: US 6,711,078 B2
(45) Date of Patent: Mar. 23, 2004

(54) WRITEBACK AND REFRESH CIRCUITRY FOR DIRECT SENSED DRAM MACRO

(75) Inventors: Ciaran J. Brennan, Essex Junction, VT (US); John A. Fifield, Underhill, VT (US); Jeremy K. Stephens, New Windsor, NY (US); Daniel W. Storaska, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,306

(22) Filed: Jul. 1, 2002

(65) Prior Publication Data
US 2004/0001382 A1 Jan. 1, 2004

(51) Int. Cl.[7] ................................. B11C 7/00
(52) U.S. Cl. .................. 365/205; 365/63; 365/203; 365/222
(58) Field of Search .................. 365/63, 205, 208, 365/203, 222, 189.01

(56) References Cited

U.S. PATENT DOCUMENTS

| 5,831,919 A | 11/1998 | Haukness | 365/205 |
| 5,848,001 A | 12/1998 | Kim | 365/190 |
| 5,926,422 A | 7/1999 | Haukness | 365/201 |
| 6,072,749 A | 6/2000 | Nakamura et al. | 365/238.5 |
| 6,128,238 A | 10/2000 | Nagai et al. | 365/207 |
| 6,205,076 B1 | 3/2001 | Wakayama et al. | 365/222 |

*Primary Examiner*—Gene Auduong
(74) *Attorney, Agent, or Firm*—Scully, Scott, Murphy & Presser; Robert A. Walsh, Esq.

(57) ABSTRACT

A writeback and refresh circuit for a direct sense architecture memory wherein a plurality of primary sense amps are connected to a global data line and also to bitlines, each of which is coupled to an array of memory storage cells which are selected for write and read operations by a plurality of wordlines. A single secondary sense amp receives analog level data from the primary sense amps over the global data line, and includes a restore/writeback circuit which digitizes the data and then returns the digitized data over the global data line to the primary sense amp and back into the memory. A 2-cycle read/writeback operation is used for each memory read cycle, a first cycle read operation, and a second cycle writeback operation. The 2-cycle destructive read architecture eliminates the need for a cache and complex caching algorithms.

20 Claims, 3 Drawing Sheets

DRAM MEMORY ARRAY

PRIMARY DSA

PRIMARY DSA

WRITEBACK AND REFRESH CIRCUITRY FOR DIRECT SENSED DRAM MACRO

BACKGROUND OF THE INVENTION

1. Field of the Invention

The present invention relates generally to writeback And refresh circuitry for a direct sensed DRAM macro, and more particularly pertains to writeback and refresh circuitry for a direct sensed DRAM macro wherein bitline data is sensed with a primary sense amp (PSA) without a storage means, and then the data is transferred to a latch in a secondary sense amp (SSA) which is common to a group of direct sense memory arrays. A single MDQ master data line is used to first carry the read data as an analog level signal to the SSA, which digitizes the data and then returns the digitized data over the same MDQ global data line as a full-rail digital signal back to PSA and the memory array bitlines.

2. Discussion of the Prior Art

Direct sense memory arrays are memory arrays wherein only the gate of the sense device/transistor is connected to a sensed bitline BL, such that the sense device does not provide any feedback to or alter the signal on the sensed bitline BL. This is in contrast to other prior art nondirect sense memory arrays which include a cross coupled latch wherein typically both the gate and the drain of a sense device/transistor are connected to a sensed bitline BL, and wherein the sense device provides feedback to and alters the signal on the sensed bitline BL.

Direct sense memory arrays typically use a dense and high speed primary sense amp (PSA) which does not latch sensed data during a read operation, and the sensed data is typically directed to an external cache, from which it is written back into the memory array during a refresh operation, which is a very time consuming operation and also requires the use of the external cache which could otherwise be performing other functions in the system. As such, an accessed memory storage cell does not get directly written back, or restored, after a read operation, but rather has an indirect writeback or restore operation.

In a typical nondirect prior art direct sense memory array, data is stored in a latch in the PSA, and is then directly written from the PSA into a memory storage cell. In contrast thereto, in the present invention data is stored in a latch in the secondary direct sense amp (SSA) where it is further amplified and stored as a true digital signal, and is then written directly from the SSA into a memory storage cell.

SUMMARY OF THE INVENTION

Accordingly, it is a primary object of the present invention to provide writeback and refresh circuitry for a direct sensed DRAM macro wherein bitline data is first sensed with a primary sense amp (PSA) without a storage means, and then the data is transferred to a latch in a secondary sense amp (SSA) which is common to a group of direct sense memory arrays. A single MDQ master data line is used to first carry the read data as an analog level signal to the SSA, which digitizes the data and then returns the digitized data over the same MDQ global data line as a full-rail digital signal back to the PSA and the memory array bitlines.

The present invention provides a circuit for performing a write operation, and a 2-cycle read-write refresh operation to refresh a dynamic eDRAM direct sense memory array. The PSA reads the data and then transfers the data to a shared SSA along a shared MDQ global data line. The SSA converts the analog data to digital data with a resistive isolation device and a latch with weak feedback. The resistive isolation device and a read current supply in the SSA are then shut off, after which a feedback device in the SSA is enabled to pass the inverted and amplified data back to the array cell over the shared MDQ global data line.

The present invention provides a read/writeback mechanism in a destructive read memory array wherein 2-cycles are used for each memory read cycle, a first cycle read operation, and a second cycle writeback operation. The 2-cycle destructive read architecture eliminates the need for a cache and complex caching algorithms.

BRIEF DESCRIPTION OF THE DRAWINGS

The foregoing objects and advantages of the present invention for a writeback and refresh circuitry for a direct sensed DRAM macro may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

Figure 1:
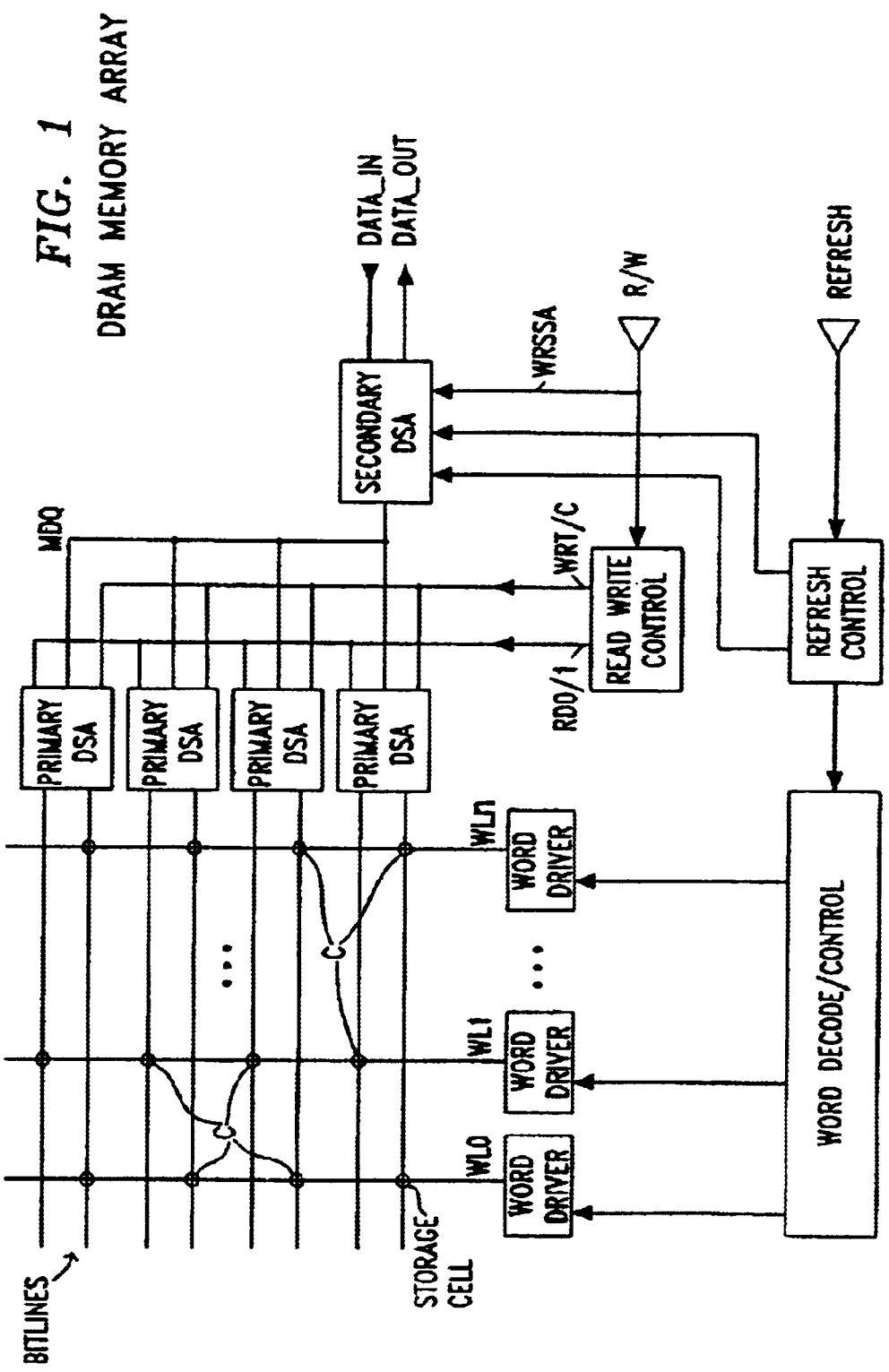
FIG. 1 illustrates a Write-Refresh circuit for a direct sense memory architecture pursuant to the present invention.
Figure 2:
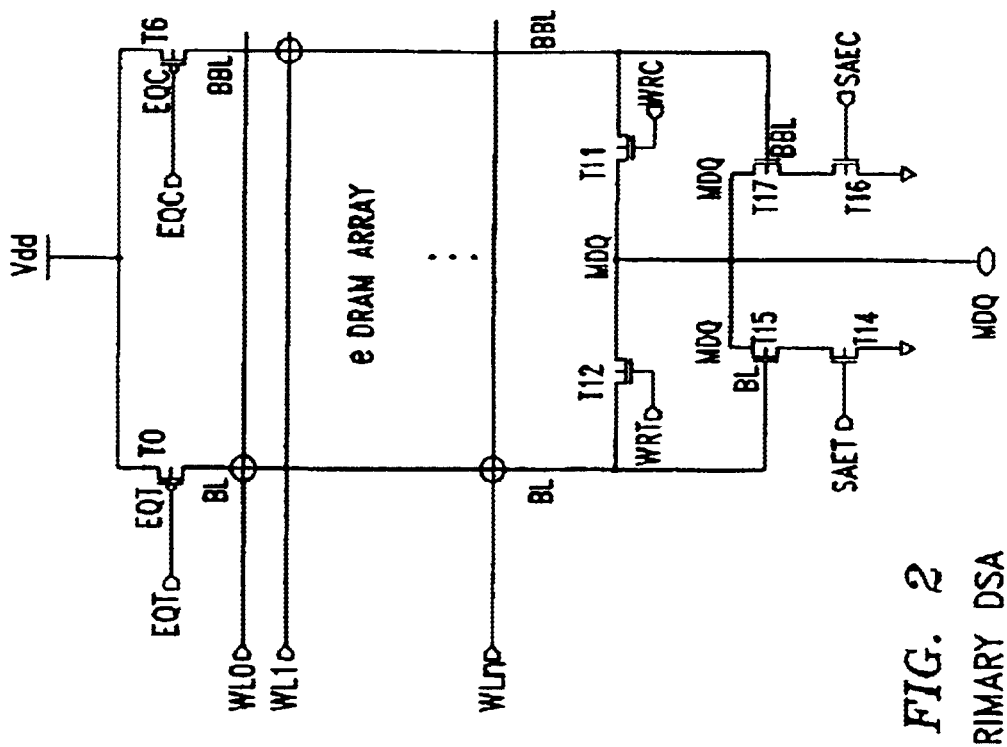
FIG. 2 illustrates a primary direct sense amp (PSA) pursuant to the present invention as can be used in the circuit of FIG. 1.

Referring to FIG. 1, an array of dynamic memory storage cells C are connected to a plurality of primary direct sense amps (PSAs), each of which can comprise the circuit of FIG. 2. The outputs of the plurality of primary PSAs are connected to a single secondary direct sense amp (SSA) which can comprise the circuit of FIG. 3, through a common MDQ global data line. The basic direct sense read operation is described in U.S. patent application Ser. No. 09/870,755, filed May 31, 2001 and entitled Single Bitline Direct Sensing Architecture.

FIG. 2 illustrates a PSA pursuant to the present invention as can be used in the circuit of FIG. 1. The PSA includes:

a pair of precharge/equalize PFET devices T0, T6 coupled between a power supply Vdd and the respective bitlines BL, BBL, which are coupled to memory storage cells C which are selected for write and read operations by a plurality of wordlines WLn;

a pair of write switch NFET devices T12, T11 coupled respectively between the bitlines BL, BBL and the MDQ global data line;

a pair of read NFET devices T15, T17 coupled respectively between the bitlines BL, BBL and the MDQ global data line;

a pair of read enable/switch devices T14, T16 coupled in series respectively with the read devices T15, T17 and ground, all of which are connected as shown in FIG. 2.

During a read operation of a data 0 the devices T15, T17 convert a read signal of tens of millivolts on the bitlines BL, BBL to a signal of hundreds of millivolts on the MDQ global data line. The PSA uses write devices T12, T11 which are NFET devices operated with a boosted gate level signal WRT, WRC, which is a denser design relative to circuits which use a pair of complementary transistors.

Figure 3:
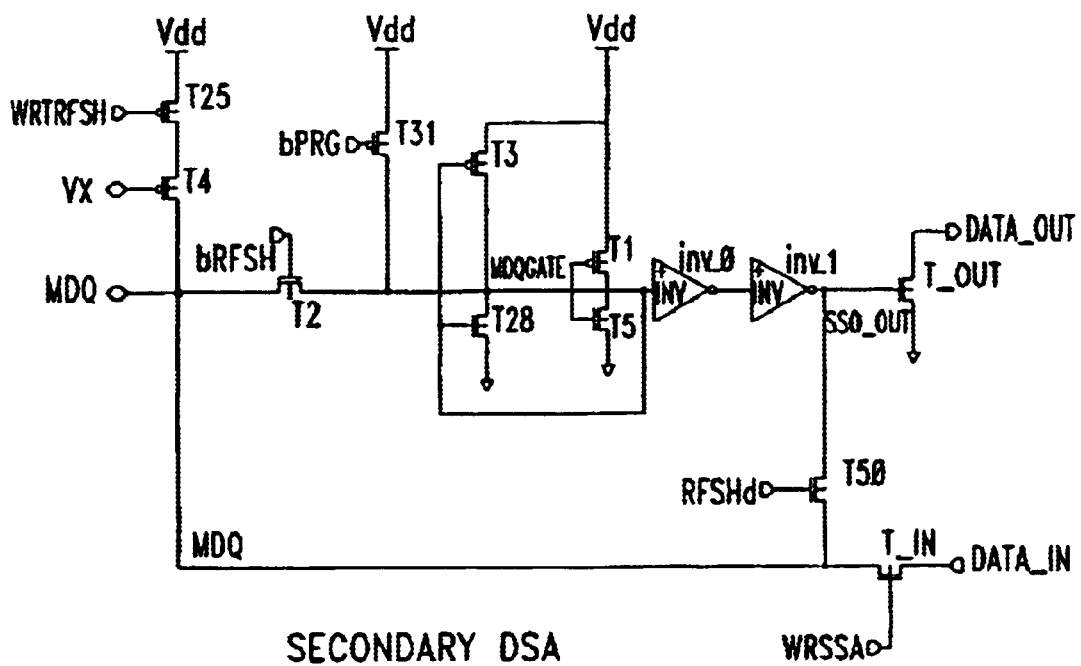
FIG. 3 illustrates a secondary direct sense amp (SSA) pursuant to the present invention as can be used in the circuit of FIG. 1.

FIG. 3 illustrates an SSA pursuant to the present invention as can be used in the circuit of FIG. 1. The SSA comprises:

a current 1 supply PFET device T4 connected in series with an enable/switch PFET device T25, which are connected between a power supply Vdd and the MDQ global data line, and during a read operation of a data 1, the read devices T15, T14 of the PSA are turned on and connect the MDQ global data line to ground, and the current supply devices T4, T25 function similar to a resistive voltage divider network to allow the global data line MDQ to proceed to ground;

a horizontal resistive isolation NFET device T2, biased to operate in its linear range of amplification, coupled between the MDQ global data line and an inverting latch which isolates/decouples the global data line from the inverting latch;

a cross couple inverting latch, coupled to the output of the resistive isolation device T2, and comprising latch output devices T1, T5, and feedback devices T3, T28 which provide a weak feedback signal such that the latch is stable in a first state but is more stable in a second state, such that it is more easily switched from the first state to the second state than vice versa, to provide a hair trigger type of switching operation;

a precharge device T31 coupled between the power supply Vdd and the input to the latch; a pair of inventors inv_0,inv_1, coupled between the output of the latch and an output node ssa_out, to provide buffering therebetween and also to convert the latch output signal to a signal at ground for a data 0 and at full rail voltage of approximately 1 volt for a data 1;

an open drain, pull down and inverting device T_OUT connected between the output node ssa_out and a data_out line;

a refresh/rewrite device T50, connected between the output node ssa_out and the MDQ global data line, which is turned on during a refresh/rewrite operation to rewrite data back into the memory array;

a data write device T_IN, connected between a data_in line and the MDQ global data line, which is turned on during a data write operation to write data back into the memory array.

During a read operation, a data 1 in a memory cell translates through the SSA circuit of FIG. 3 to a full rail high signal at approximately 1 volt at node ssa_out, which during a read operation is inverted to an opposite polarity data signal on data_out, and during a writeback operation is read as a data 1 at node ssa_out by refresh device T50.

Referring collectively to FIGS. 1, 2 and 3, during a write operation, the data_in line drives the SSA, in which the data write device T_IN is activated by a write signal WRSSA, and its output is directed to the common MDQ global data line. The common MDQ global data line drives the plurality of PSAs. A pair of PSA write switches, having inputs of WRT and WRC of FIG. 2, are decoded in on or more selected PSA(s), as selected by a WRT/C signal on a bus from the Read Write Control, and direct the incoming data to the proper bitline and memory storage cell. The bitlines were initially precharged to a high level Vblh=Vdd at the end of the previous cycle, such that in the PSA a single NFET device T12 or T11 with a boosted WRSSA level is sufficient to write a "1" or a "0" data level to the bitline and the selected storage cell, which is selected by the Word Decode/Control which activates a selected Word Driver to write the data into the storage cell activated by both the selected wordline WLn and the selected PSA.

During a read operation, the read data is amplified in the following manner. The PSA of FIG. 2 connects the bitlines BL, BBL directly to the gate of a data sensing FET, T15 for BL, T17 for BBL The data level on the bitline determines a corresponding data level on the MDQ global data line which is driven by the outputs of T15 and T17, and which is connected to both the current load device T4 and the resistive isolation device T2 of the SSA of FIG. 3. The resistive isolation device T2 passes the MDQ global data line signal to precharged latch devices T1, T3, T5 and T28, which are precharged by device T31, and the latch latches and inverts the input signal MDQGATE. Additional buffering is provided by serially connected inverters inv_0 and inv_1 at the output of the latch, which also provide a full rail data 1 or 0 at the node ssa_out, which drives the output device T_OUT, the inverted output of which drives the data_out line. The data_out line has a relatively large capacitance, such that the device T_OUT is rather large, and the inverters inv_0 and inv_1 buffer the inverting latch from the large capacitance of the device T_OUT is activated.

As an example, assume a read operation of a data 1 from a memory storage cell connected to bitline BL and activated by the selected wordline WLn. The bitline BL is initially precharged by precharge device T0, and a read data 1 on the bitline causes the bitline to remain at the precharge level, which fully turns on device T15. Device T14 is also activated, connecting MDQ through T14, T15 to ground and causing the signal voltage or MDQ to drop, which is the input signal to the SSA. In the SSA, the drop in MDQ causes resistive device T2 to produce a lower output, such that MDQGATE goes to essentially ground, such that the latch, which has also been precharged, inverts and produces a latch output signal of 1. The data_out line is also precharged high to Vdd. The inverters inv_0 and inv_1 provide a full rail high output signal of approximately 1 volt at node ssa_out, which turns device T_OUT on to connect the data_out line to ground therethrough, such that data_out line drops from its precharge level toward ground, such that an inverted data signal is produced on the data_out line.

A read data 0 on the precharged bitline BL causes the BL signal to drop, which limits the turn on of, and only partially turns on, the device T15, such that MDQ does not drop as much as for a data 1, but drops to a voltage level of several hundred millivolts, such that the device T2 in the SSA passes a higher signal to the input MDQGATE of the latch, causing the inverting latch to latch to a data 0, such that the inverters inv_0, inv_1 produce a true digital data 0 output signal at output node ssa_out, which does not turn device T_OUT on, causing the line data_out line to remain at its precharge level to produce an inverted data signal on the data_out line.

Following a destructive read operation, for a writeback of the data signal, in the SSA the devices T2 and T25 are turned off, and then the refresh device T50 is turned on by a boosted gate signal RFSHd. In the case of a data 1, this causes a full Vdd to pass through device T50 to charge MDQ to Vdd. In the PSA, device T12 or T11 is turned on to write the data 1 to bitline BL or BBL in the case of a data 0, a ground level 0 voltage signal passes through device T50 to pull MDQ to ground. In the PSA device, T12 or T11 is turned on to write the data 0 to bitline BL or BBL A write operation proceeds in a manner similar to a writeback operation, but instead of activating refresh device T50, write device T_IN is activated to write the data on the data_in line back into the memory array.

The primary and secondary direct sense amps as described above differ from prior art nondirect read architectures which perform the data latching and writeback operations in the PSA rather than in the SSA, as in the present invention. The present invention is more efficient from a circuit area viewpoint as a memory array includes many more primary DSAs than secondary DSAs.

A 2-cycle memory write/refresh operation can be performed in the direct sense architecture of the present invention by first transferring the data from one array in the memory bank to a multiplexed SSA in a first memory read cycle. In a second cycle, the devices T2 and T25 are shut off, and the device T50 is then activated, and the amplified read data is directed back to the PSA in a refresh operation as described above. This is best accomplished by leaving the wordline active for both of the 2-cycles, with no wordline restore between the read and write/refresh operations. The return path device T50, with its gate connected to a RFSHd signal, is used to connect the amplified ssa_out data node signal back to the MDQ master data line.

Figure 4:
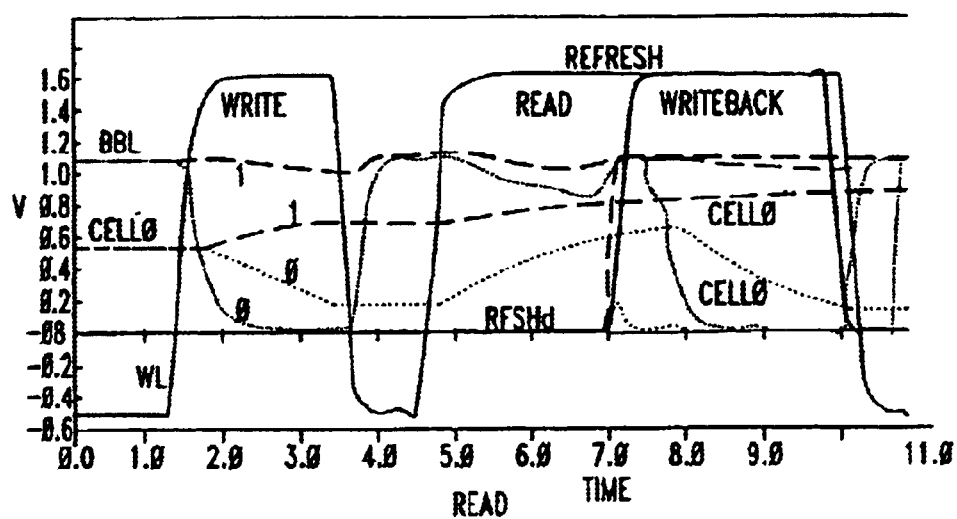
FIG. 4 illustrates the timing of waveforms used to perform a 2-cycle refresh, or writeback, of both "1" and "0" data.

FIG. 4 illustrates the timing of waveforms used to perform a 2-cycle refresh, or writeback, of both "1" and "0" data. The bitline can be precharged/restored to its vblh=Vdd level before the writeback for an improved "1" level, or alternatively the bitline EQ could be inhibited for an improved "0" writeback, with a circuit designer being able to choose either option. Note in FIG. 4 that both a data 1 and a data 0 are rewritten into the memory storage cell at an improved respectively higher and lower signal level than the original read data 1 and data 0.

Figure 5:
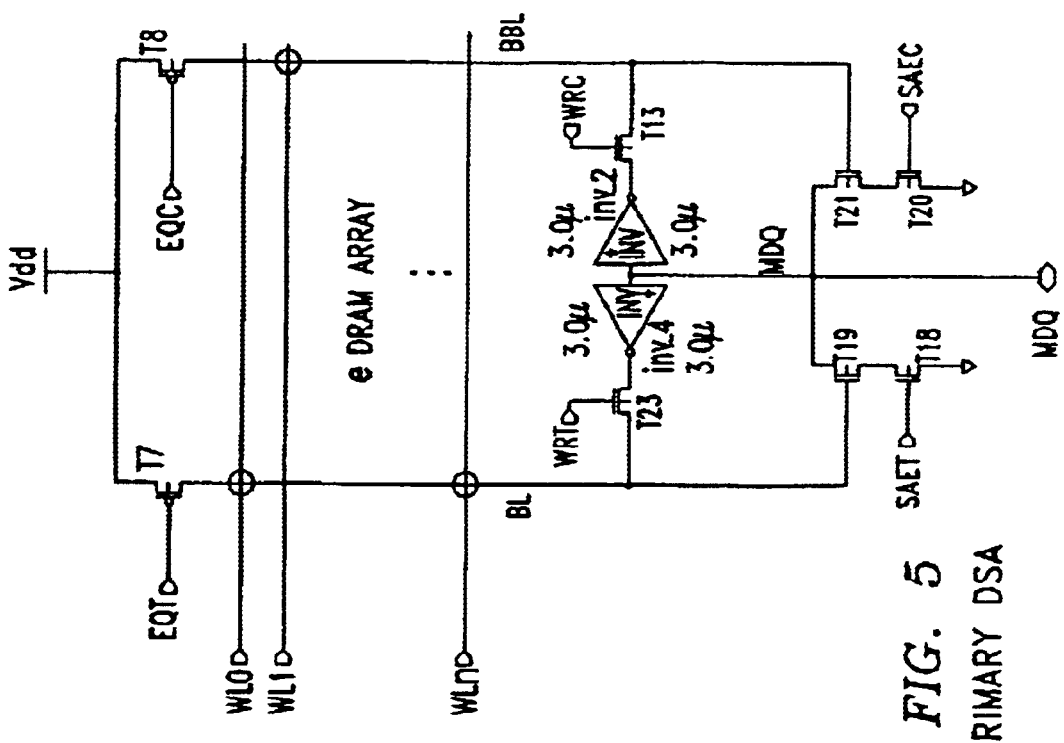
FIG. 5 illustrates a PSA with a local writeback wherein the sensed/read data is written back through the PSA with an inverted write path

FIG. 5 illustrates an alternate embodiment wherein inverted digitized data is fed back onto the bitlines without the use of a cross coupled storage latch. Write data_in is pre-inverted and sent up the MDQ master data line from external sources, and read data is inverted and directed through the same write devices (WRT, WRC) as used in the external write path.

FIG. 5 illustrates a PSA with a local writeback wherein the sensed/read data is written back through the PSA with an inverted write path. It should be recalled that the data level on the MDQ global data line is inverted, being low for a data 1 and high for a data 0. Accordingly, in this alternative embodiment, the level on the MDQ master data line is digitized and inverted by one of two additional inverters, inv_2 for bitline BL, and inv_4 for bitline BBL The Vdd power supply lines for these inverters can be switched off during a read operation, and powered on during a write operation. Similar to the PSA of FIG. 2, the WRT or WRC control gates of respective devices T23 and T13 are activated after a read operation to perform a direct writeback of data back to the storage memory storage cell. The inverters are designed with beta ratios similar to the beta ratios of the main inverter in the latch of the SSA so as to convert the analog MDQ voltage to full rail digital data This circuit will begin a writeback operation sooner in a 2-cycle writeback cycle, and accordingly is faster (and also denser) than the circuit of FIG. 2, but may not be able to write complete rail voltages to the bitlines. This circuit also receives assistance from the SSA as feedback from MDQGATE to MDQ assists in the writeback operation, and moreover device T50 is no longer required.

The present invention changes the timing of the wordline WL to effect an efficient refresh for a direct sense, destructive-read sensing scheme. For a normal prior art read and write cycles, the wordline WL is active for one cycle for a read operation and one cycle for a write operation, with an interim restore between the read and write operations. In contrast thereto, in the present invention, for a refresh cycle, the wordline active time is altered and remains active for 2-cycles with no interim reset.

The subject invention restores cell data by first sensing bitline data with a PSA sensing circuit without a storage means, and then transfers the data to a latch in the SSA which is common to a group of direct sense memory arrays. A single MDQ master data line is used to first carry the read data as an analog level which is passed to the SSA, and then after it is digitized, the digitized data is returned on the same MDQ global data line as a full-rail digital signal back to the memory array bitlines.

The disclosed circuits and timing sequences read the data with the PSA and transfer the data to a shared SSA along a shared MDQ global data line, and convert the analog data to digital data with an isolation device and a latch with weak feedback. The resistive isolation device n and the read current supply from the devices T25/T4 are then shut off, after which the feedback device T50 is enabled to pass the inverted and amplified data back to the array cell on the shared data line.

The present invention improves the write cell levels. As shown by the original sense signal levels and the refresh/writeback signal levels of FIG. 4, the refresh operation strengthens the cell data beyond the normal write cell levels, because a 2-cycle write/refresh operation provides more write time to writeback a more complete data level into the memory cell.

The read/writeback scheme is used as the primary writeback mechanism in a destructive read memory array where 2-cycles are used for each memory read cycle. The first cycle is a read cycle, and the second cycle is a writeback operation as described. The 2-cycle destructive read architecture eliminates the need for a cache and complex caching algorithms.

The direct sense array can be used instead of an SRAM cache as in the prior art to hold refresh data, and eliminates the area penalty and complexity of an SRAM cache for a direct sensed eDRAM memory array. In destructive read arrays with caches, the writeback and refresh architecture of the present invention allows the destructive read arrays to be refreshed while the cache is performing other unrelated tasks.

While several embodiments and variations of the present invention for a writeback and refresh circuitry for direct sensed DRAM macro are described in detail herein, it should be apparent that the disclosure and teachings of the present invention will suggest many alternative designs to those skilled in the art.

What is claimed is:

1. A writeback and refresh circuit for a direct sense architecture memory comprising:

a singe global data line;

a plurality of primary sense amps connected to the single global data line, wherein each primary sense amp outputs a single data signal over the single global data line, and also connected to bitlines, each of which is coupled to an array of memory storage cells which arm selected for write and read operations by a plurality of wordlines;

a single secondary sense amp connected to the single global data line, wherein the secondary sense amp receives a single data signal from each of the primary sense amps over the single global data line, and includes a restore/writeback circuit to writeback data over the single global data line to a primary sense amp and back into the memory.

2. The circuit of claim 1, wherein the secondary sense amp includes a latch.

3. The circuit of claim 1, wherein each primary sense amp includes at least one direct sense device, and only the gate of each direct sense device is connected to a bitline, such that the direct sense device does not provide any feedback to or alter the signal on the bitline.

4. The circuit of claim 1, wherein each primary sense amp includes:
   a precharge/equalize device, coupled between a power supply and a bitline;
   a write device, coupled between the global data line, and the bitline;
   a read device, coupled between the bitline and the global data line;
   a read enable/switch device, coupled in series with the read device and ground.

5. The circuit of claim 1, wherein each primary sense amp includes:
   a pair of precharge/equalize devices, coupled between a power supply and a pair of bitlines;
   a pair of write switch devices, coupled between the global data line and the pair of respective bitlines;
   a pair of read devices, coupled between the pair of respective bitlines and the global data line;
   a pair of read enable switch devices, coupled in series with the pair of respective read devices and ground.

6. The circuit of claim 1, wherein the secondary sense amp comprises:
   a current supply device, connected between a power supply and the global data line;
   a resistive isolation device, biased to operate in its linear range of operation, coupled between the global data line and a cross couple inverting latch which isolates/decouples the global data line firm the cross couple inverting latch;
   a cross couple inverting latch, coupled to the output of the resistive isolation device, including a pair of latch devices and a pair of feedback devices which provide a weak feedback signal such that the latch is stable in a first state but is more stable in a second state, such that it is more easily switched from the first state to the second state than vice versa, to provide a hair trigger type of switching operation;
   a pair of inventors, coupled between the output of the latch and an output node, to provide buffering therebetween and also to convert the latch output signal to a signal at ground for a data 0 and at full rail voltage for a data 1;
   a pull down and inverting device connected between the output node and a data out line;
   a refresh/rewrite device, connected between the output node and the global data line, which is turned on during a refresh/rewrite operation to rewrite data back into the memory;
   a data write device, connected between a data in line and the global data line, which is turned on during a data write operation to write data into the memory.

7. The circuit of claim 6, further including
   a current enable/switch device connected in series with the current supply device between the power supply and the global data line;
   a precharge device, coupled between the power supply and the input to the latch.

8. The circuit of claim 7, wherein during a 2-cycle memory read and refresh operation, in a first memory read cycle data is transferred from one array in the memory through a primary sense amp to the secondary sense amp which is multiplexed and shared between the plurality of primary sense amps, and in a second memory refresh cycle data is transferred from the secondary sense amp to a selected primary sense amp back to the one array in the memory.

9. The circuit of claim 8, wherein during the second memory refresh cycle in the secondary sense amp, the current enable/switch device and the resistive isolation device are turned off, and then the refresh device is turned on with a boosted gate signal, and in the primary sense amp, a write device is turned on.

10. The circuit of claim 9, wherein during the 2-cycle memory write refresh operation, the wordline remains active for 2-cycles with no interim reset.

11. The circuit of claim 10, wherein in the first cycle a primary sense amp senses the data on a bitline, and transfers the data over the global data line as an analog level signal to a latch in the multiplexed secondary sense amp which digitizes the data, and in the second cycle the digitized data is returned over the global data line as a full-rail digital signal back to the primary sense amp which writes the data back into the memory array.

12. The circuit of claim 11, wherein in the secondary sense amp the analog data is converted to digital data by the resistive isolation device and the cross couple inverting latch, after which the resistive isolation device and the current supply device are shut off, after which the writeback back device is enabled to pass the inverted and amplified data back to the memory army cell over the global data line.

13. The circuit of claim 1, wherein during a 2-cycle memory read and refresh operation, in a first memory read cycle data is transferred from one array in the memory through a primary sense amp to the secondary sense amp which is multiplexed and shared between the plurality of primary sense amps, and in a second memory refresh cycle data is transferred from the secondary sense amp to a selected primary sense amp back to the one array in the memory.

14. The circuit of claim 13, wherein during the 2-cycle memory write refresh operation, the wordline remains active for 2-cycles with no interim reset.

15. The circuit of claim 14, wherein in the first cycle a primary sense amp senses the data on a bitline, and transfers the data over the global data line as an analog level signal to a latch in the multiplexed secondary sense amp which digitizes the data, and in the second cycle the digitized data is returned over the global data line as a full-rail digital signal back to the primary sense amp which writes the data back into the memory array.

16. The circuit of claim 1, wherein in the first cycle a primary sense amp senses the data on a bitline and transfers the data over the global data line as an analog level signal to a latch in the multiplexed secondary sense amp which digitizes the data, and in the second cycle the digitized data is returned over the global data line as a full-rail digital signal back to the primary sense amp which writes the data back into the memory array.

17. A direct sense primary sense amp comprising:
   a precharge/equalize device, coupled between a power supply and a bitline;
   a write device, coupled between a single global data line, and the bitline;

a read device, coupled between the bitline and the single global data line;

a read enable/switch device, coupled in series with the read device and ground;

an inverter coupled between the singe global data line and the write device, such that a single inverted digitized data signal on the single global data line is inverted and directed through the write device.

18. The circuit of claim 17, wherein the power supply for the inverter is switched off during a read operation, and powered on during a write operation.

19. A direct sense primary sense amp comprising:

a pair of precharge/equalize devices, coupled between a power supply and a pair of respective bitlines;

a pair of write devices, coupled between a single global data line and the pair of respective bitlines;

a pair of read devices, coupled between the pair of respective bitlines and the single global data line;

a pair of read enable switch devices, coupled in series with the pair of respective read devices and ground;

a pair of inverters, coupled between the singe global data line and the pair of respective write devices.

20. The circuit of claim 19, wherein the power supply for the inverter is switched off during a read operation, and powered on during a write operation.

* * * * *